(12) United States Patent
Sumida et al.

(10) Patent No.: US 12,372,187 B2
(45) Date of Patent: Jul. 29, 2025

(54) CONNECTION STRUCTURE OF PIPE (71) Applicants: UCHIYAMA MANUFACTURING CORP., Okayama (JP); DENSO CORPORATION, Kariya (JP)

(72) Inventors: Tomokazu Sumida, Okayama (JP); Takefumi Tanaka, Okayama (JP); Nobuaki Sasaji, Okayama (JP); Mach Do Khoa, Okayama (JP); Yasuhide Kiyomune, Okayama (JP); Daisuke Endo, Okayama (JP); Hiroki Mizutani, Kariya (JP)

(73) Assignees: UCHIYAMA MANUFACTURING CORP., Okayama (JP); DENSO CORPORATION, Kariya (JP)

( * ) Notice: Subject to any disclaimer, the term of this patent is extended or adjusted under 35 U.S.C. 154(b) by 330 days.

(21) Appl. No.: 18/149,647

(22) Filed: Jan. 3, 2023

(65) Prior Publication Data

US 2024/0027011 A1 Jan. 25, 2024

(30) Foreign Application Priority Data

Jul. 21, 2022 (JP) .................. 2022-116232

(51) Int. Cl.
*F16L 41/08* (2006.01)
*H05K 7/20* (2006.01)
(52) U.S. Cl.
CPC ........ *F16L 41/088* (2013.01); *H05K 7/20272* (2013.01)

(58) Field of Classification Search
CPC ....... F16L 41/088; F16L 5/10; H05K 7/20272
See application file for complete search history.

(56) References Cited

U.S. PATENT DOCUMENTS

| 2018/0265018 | A1* | 9/2018 | Yabashi | .................. F16L 5/10 |
| 2020/0080640 | A1* | 3/2020 | Yamamoto | ................ F16L 5/10 |
| 2023/0097233 | A1* | 3/2023 | Schmitt | .............. H05K 7/20272 |
| | | | | 285/13 |

FOREIGN PATENT DOCUMENTS

| JP | 202041632 | 3/2020 |
| JP | 6818303 | 1/2021 |

* cited by examiner

*Primary Examiner* — David Bochna
(74) *Attorney, Agent, or Firm* — MUNCY, GEISSLER, OLDS & LOWE, P.C.

(57) ABSTRACT

In a connection structure of a pipe in which a first pipe provided outside a case and a second pipe provided inside the case are connected via a gasket while sealing a space between the first pipe and a through hole provided on a wall body of the case and a space between the through hole and the second pipe, the gasket has a tubular first holding portion, an inner circumferential first lip portion, an outer circumferential lip portion, a tubular second holding portion, and an inner circumferential second lip portion. Resistance applied on the first holding portion including the inner circumferential first lip portion when the first pipe is pulled out of the through hole is smaller than total of resistance generated in the outer circumferential lip portion against pull-out direction and resistance generated in the inner circumferential second lip portion against pull-out direction.

6 Claims, 5 Drawing Sheets

CONNECTION STRUCTURE OF PIPE

BACKGROUND OF THE INVENTION

Field of the Invention

The present invention relates to a connection structure of a pipe in which a first pipe provided outside a case and a second pipe provided inside the case are connected via a gasket while sealing a space between the first pipe and a through hole provided on a wall body of the case and a space between the through hole and the second pipe.

Description of the Related Art

Examples of the connection structure as described above are disclosed in the following Patent Document 1 and Patent Document 2. Patent Document 1 and Patent Document 2 below disclose a gasket that seals a space between a through hole provided on a wall body of a case and a pipe inserted into the through hole. The gasket is provided at a position where an inner seal area having an inner circumferential lip portion elastically contacting an outer circumferential surface of the pipe does not overlap radially with an outer seal area on an outer circumferential side where an outer circumferential lip portion elastically contacting an inner circumferential lip portion of the through hole is provided. As a result, the influence of eccentricity on seal surface pressure is suppressed, and the insertion load of the pipe is reduced, thereby realizing a gasket with good assembly performance.

CITATION LIST

Patent Literature

PTL 1: Japanese Patent No. 6818303
PTL 2: Japanese Unexamined Patent Application Publication No. 2020-41632

SUMMARY OF THE INVENTION

Problems to be Solved by the Invention

In the connection structure as described above, the pipe provided outside the case is sometimes removed during maintenance or the like. However, in Patent Document 1 and Patent Document 2, it is assumed that not only the pipe but also the gasket is pulled out and removed when the pipe provided outside the case is pulled out from the through hole, and it is not configured to pull out only the pipe provided outside the case. When a fluid such as a cooling medium or the like flows through the pipe, if the gasket is pulled out together with the pipe during maintenance, the fluid, dust, etc. may enter the case from the through hole because the through hole becomes unsealed.

An object of the present invention is to provide a connection structure of a pipe in which only a pipe is pulled out when the pipe provided outside a case is pulled out from a through hole.

Means of Solving the Problems

In order to achieve the above-mentioned object, in a connection structure of a pipe in which a first pipe provided outside a case and a second pipe provided inside the case are connected via a gasket while sealing a space between the first pipe and a through hole provided on a wall body of the case and a space between the through hole and the second pipe, the gasket has a tubular first holding portion to be fitted onto one end of the first pipe, an inner circumferential first lip portion provided on an inner circumferential surface of the first holding portion and elastically contacting an outer circumferential surface of the first pipe, an outer circumferential lip portion provided on an outer circumferential surface of the first holding portion and elastically contacting an inner circumferential surface of the through hole, a tubular second holding portion to be fitted onto an end portion of the second pipe provided in the case, and an inner circumferential second lip portion provided on an inner circumferential surface of the second holding portion and elastically contacting an outer circumferential surface of the second pipe. Resistance applied on the first holding portion including the inner circumferential first lip portion when the first pipe is pulled out of the through hole is smaller than total of resistance generated in the outer circumferential lip portion against pull-out direction and resistance generated in the inner circumferential second lip portion against pull-out direction.

In the above-mentioned connection structure of a pipe, lubricant can be applied on an elastic contact region of the inner circumferential first lip portion with the outer circumferential surface of the first pipe. In the above-mentioned connection structure of a pipe, the first pipe can have an annular groove portion to be fitted with the first holding portion, and the first holding portion can have a flat portion formed to be flat so as to abut along an outer circumferential wall of the annular groove portion, and lubricant can be applied on an elastic contact region of the flat portion with the outer circumferential wall. In addition, in the above-mentioned connection structure of a pipe, the case can house electronic equipment, and cooling medium for cooling the electronic equipment can flow through the first pipe and the second pipe.

Effects of the Invention

Since the connection structure of the pipe according to the embodiments of the present invention has the above-described configuration, only the pipe is pulled out when the pipe provided outside the case is pulled out from the through hole.

DESCRIPTION OF THE EMBODIMENTS

Figure 2:
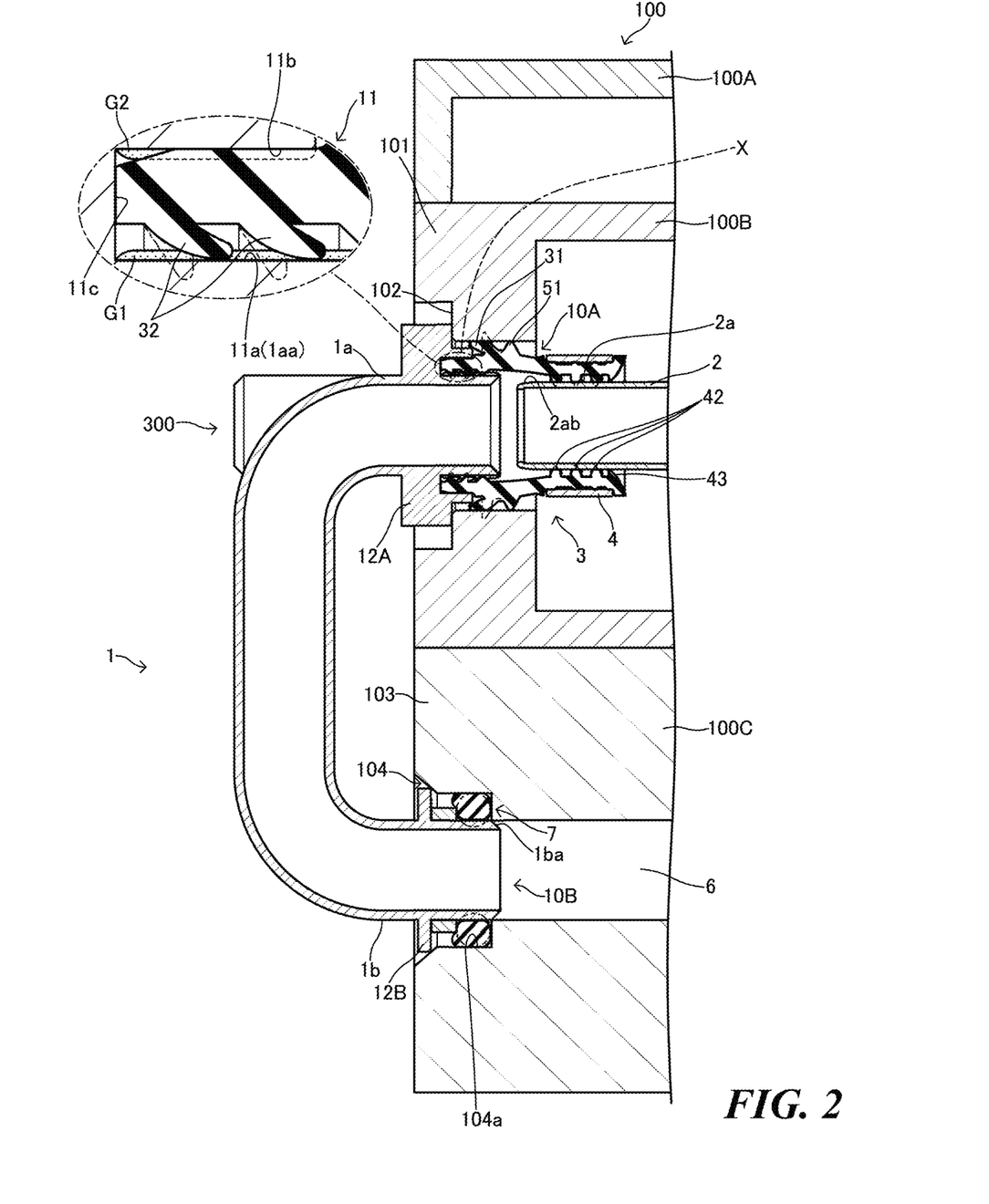
FIG. 2 is a diagram to explain the connection structure of the pipe according to the embodiment, and is a schematic partial cross-sectional view illustrating a connection region of the case and the pipe illustrated in FIG. 1.
Figure 3:
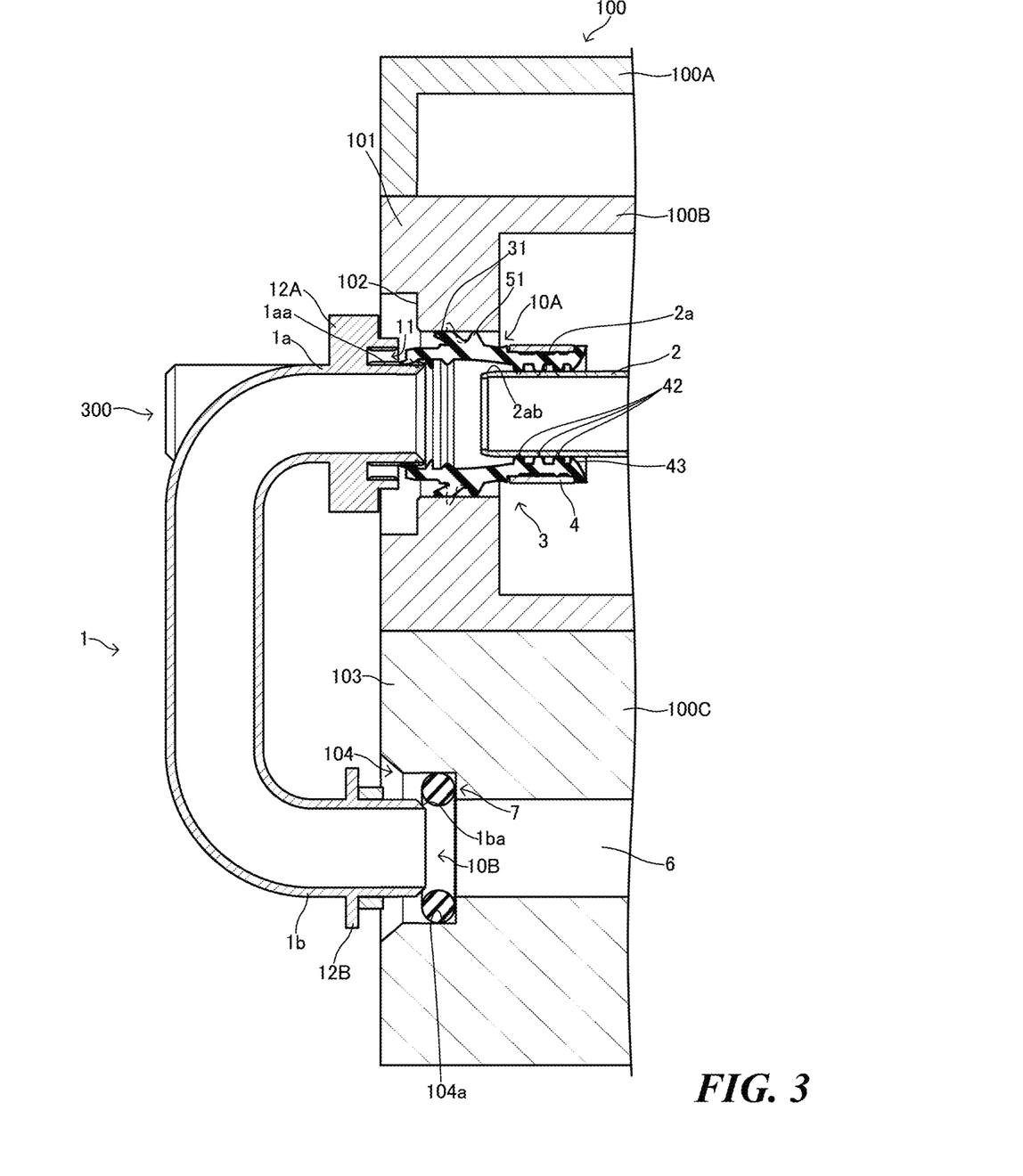
FIG. 3 is a diagram to explain the connection structure of the pipe according to the embodiment, and is a schematic partial cross-sectional view illustrating a process of pulling out one of the pipes connected via the gasket.
Figure 4:
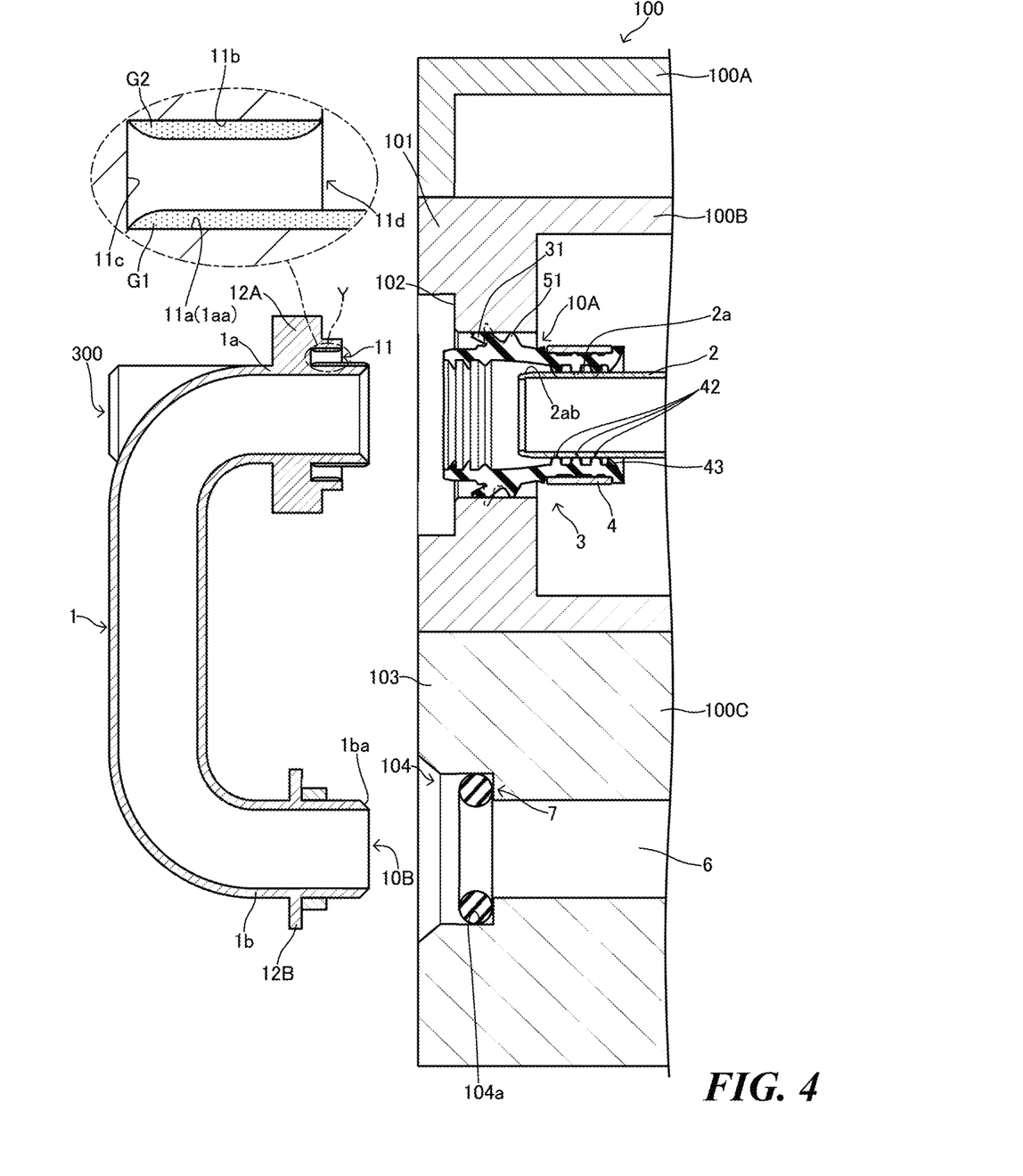
FIG. 4 is a diagram to explain the connection structure of the pipe according to the embodiment, and is a schematic partial cross-sectional view illustrating a process of pulling out only one of the pipes connected via the gasket.
Figure 5:
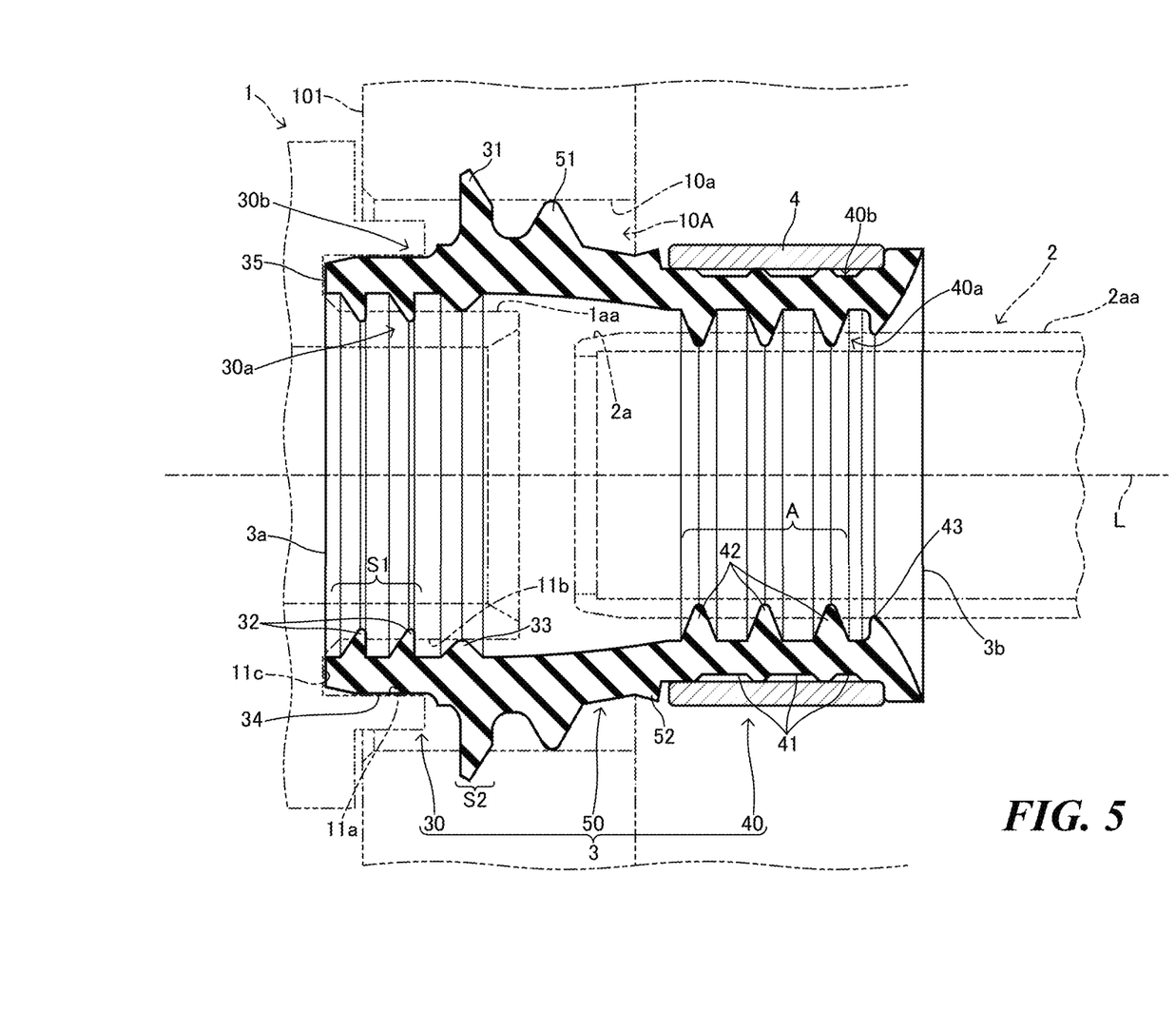
FIG. 5 is a schematic cross-sectional view to explain the gasket used for connecting pipes according to the embodiment.

Hereinafter, the embodiments of the present invention are described with reference to the drawings. In some figures, some detailed reference numerals allotted to other figures are omitted. In FIG. 5, in order to explain the shape of the components of a gasket 3 in an easy-to-understand manner, the gasket 3 having an original shape without being elastically deformed is illustrated with a solid line, but in fact, the gasket 3 is assembled in an elastically deformed condition as illustrated in FIG. 2 to FIG. 4.

In the connection structure of the pipe according to the present embodiment, a first pipe 1 provided outside a case 100 and a second pipe 2 provided inside the case 100 are connected via the gasket 3 while sealing a space between the first pipe 1 and a through hole 10A provided for a wall body 101 of the case 100 and a space between the through hole 10A and the second pipe 2. The gasket 3 includes a tubular first holding portion 30 that is fitted onto one end 1a of the first pipe 1, an inner circumferential first lip portion 32 formed on an inner circumferential surface 30a of the first holding portion 30 and elastically contacting an outer circumferential surface 1aa of the first pipe 1, an outer circumferential lip portion 31 formed on an outer circumferential surface 30b of the first holding portion 30 and elastically contacting an inner circumferential surface 10a of the through hole 10A, a tubular second holding portion 40 to be fitted onto an end portion 2a of the second pipe 2 provided in the case 100, and an inner circumferential second lip portion 42 formed on an inner circumferential surface 40a of the second holding portion 40 and elastically contacting an outer circumferential surface 2aa of the second pipe 2. In the connection structure of the pipe, the resistance on the first holding portion 30 including the inner circumferential first lip portion 32 when the first pipe 1 is pulled out from the through hole 10A is configured to be smaller than the total of the resistance on the outer circumferential lip portion 31 against pull-out direction and the resistance on the inner circumferential second lip portion 42 against pull-out direction. Hereinafter, it will be described in detail.

The connection structure of the pipe of the present embodiment is applied, for example, as a structure that connects an external hose and the cooling pipe of a cooler that cools an automotive electronic device by cooling medium. Such a pipe connection structure is required to maintain sealing property so as to withstand the ingress of rainwater and the like from the outside and the injection of water during high-pressure cleaning of vehicles and the like even if the pipe becomes eccentric as well as to prevent the leakage of the cooling medium. In addition, it is required that only the external hose is pulled out when the external hose is pulled out from the through hole for maintenance and the like. Hereinafter explained is the connection structure of the pipe in which the second pipe 2 provided in the automotive inverter case 100 and the first pipe 1 provided outside the inverter case 100 are connected by the gasket 3. The structure of the inverter case 100 constituting a part of the power control unit or PCU is actually complicated, but is shown in a simplified manner in the figures.

<Inverter>

In an automobile equipped with an electric motor as a drive source, the operation of the electric motor is controlled by an inverter 20. The electric motor works as a motor or the like that obtains power from a battery to generate driving force, and the inverter 20 converts a DC power source supplied from the battery or the like into an AC power source by switching action to supply power to the electric motor. The inverter 20 used in such an automobile is required to have a large amount of electric power, and generates a large amount of heat since a large amount of current flows through the switching element or the like. Therefore, the inverter case 100 of the present embodiment applies to a system such that a cooling medium flow path through which a cooling medium like cooling water, a cooling solution, or the like flows is provided in the inverter case 100 and various electronic devices constituting the inverter 20 are cooled.

Figure 1:
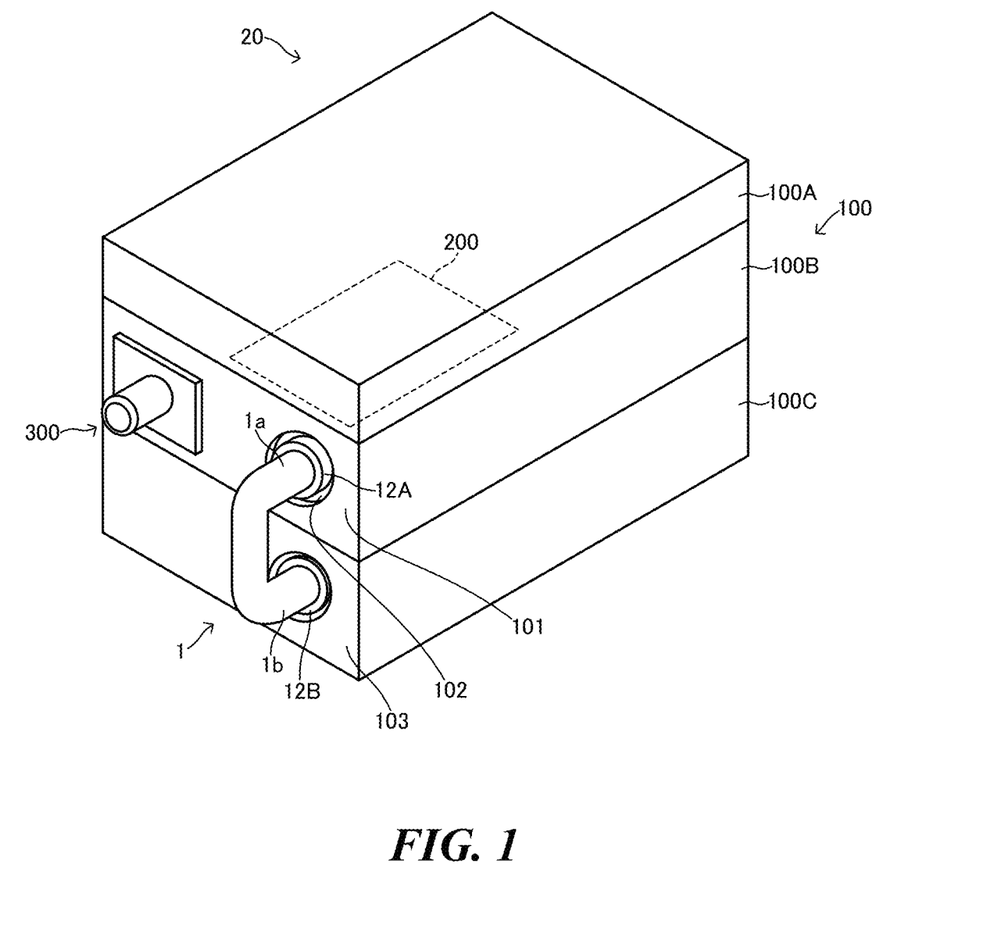
FIG. 1 is a schematic perspective view illustrating a case, a pipe, and the like applied in order to explain an example in which the connection structure of the pipe according to one embodiment of the present invention is applied.

The inverter case 100 is an approximately rectangular box body which is divided into upper and lower cases, and the inverter case 100 illustrated in FIG. 1 includes a lid case 100A, an upper case 100B, and a lower case 100C. The inverter case 100 is configured in such a manner that the upper case 100B is stacked on the lower case 100C, and the lid case 100A is covered thereon. The inverter case 100 is made of a metal material such as aluminum, a resin material, or the like, and a wall body 101 provided on the side surface of the upper case 100B has a discharge port 300 to which a pipe, not shown, for discharging the cooling medium outside the upper case 100B is connected and a circular through hole 10A, referring to FIG. 2, to which one end 1a of the first pipe 1 is connected. A step portion 102 formed in a stepped shape is provided around the through hole 10A of the wall body 101, and the step portion 102 is formed so as to be fitted with a flange portion 12A on one end 1a side of the first pipe 1. As illustrated in FIG. 2, the second pipe 2 is configured such that the tip side of the end portion 2a is located in the through hole 10A, and is configured so as to communicate with a cooling plate, not shown, provided for a stacking unit 200. A circular through hole 10B to which the other end 1b of the first pipe 1 is connected is formed on the wall body 103 provided on the side surface of the lower case 100C. A step portion 104 is provided around the through hole 10B of the wall body 103, and the step portion 104 is formed so as to be fitted with the flange portion 12B on the other end 1b side of the first pipe 1.

The cooling medium supplied from the supply port, not shown, of the lower case 100C to the lower case 100C reaches the first pipe 1 and the second pipe 2 through the cooling medium flow path 6, referring to FIG. 2 and the like, provided in the lower case 100C, and flows in the cooling plate provided for the stacking unit 200 through the second pipe 2. Then, the cooling medium flowing in the cooling medium flow path provided in the upper case 100B is finally discharged from the discharge port 300 provided for the upper case 100B.

<Gasket>

The gasket 3 is a member for connecting the first pipe 1 and the second pipe 2 and constituting the cooling medium flow path, the entire body of the gasket 3 is an elastic body made of elastomer, synthetic resin, a rubber material such as ethylene propylene rubber, butyl rubber, or silicone rubber, and the gasket 3 is a tubular molded body. The gasket 3 has a first holding portion 30, a second holding portion 40, and a joint portion 50, where one end 3a of the gasket 3 is the end portion of the first holding portion 30, and the other end 3b is the end portion of the second holding portion 40. The first holding portion 30 is fitted externally so as to cover one end 1a of the first pipe 1 and is fitted into the inner circumferential surface 10a of the through hole 10A. The second holding portion 40 is fitted externally so as to cover the end portion 2a of the second pipe 2. Since the joint portion 50 is a member that connects the first holding portion 30 and the second holding portion 40 and the joint portion 50 itself is elastic, even if the first pipe 1 and the second pipe 2 are eccentric, the radial displacement is possible. The outer diameter of the first pipe 1 is slightly larger than the outer diameter of the second pipe 2, and accordingly, the inner diameter of the first holding portion 30 is larger than the inner diameter of the second holding portion 40. Therefore, the joint portion 50 between the first holding portion 30 and the second holding portion 40 has a tapered shape that gradually reduces the diameter from the first holding portion 30 to the second holding portion 40.

<First Pipe and Second Pipe>

The first pipe 1 is constituted with a hollow cylindrical body made of a resin material, an aluminum material or the like, and is approximately shaped like the letter U. As illustrated in FIG. 1, one end 1a of the first pipe 1 is connected to the upper case 100B, and the other end 1b is connected to the lower case 100C. Thereby, the cooling medium flowing through the upper case 100B and reaching the second pipe 2 is sent to the cooling medium flow path 6 provided in the lower case 100C. The second pipe 2 is a hollow cylindrical body made of a resin material, an aluminum material or the like, and is provided so as to flow the cooling medium through the cooling plate of the stacking unit 200 to the first pipe 1.

As illustrated in FIG. 2 and so on, one end 1a of the first pipe 1 has an annular groove portion 11 and an annular flange portion 12A protruding radially outward further than the outer circumference of the groove portion 11. The groove portion 11 has a bottom portion 11c, an inner circumferential wall 11a, also constituting the outer circumferential surface 1aa of the first pipe 1, an outer circumferential wall 11b, and an opening portion 11d. The first holding portion 30 of the gasket 3 is fitted to the groove portion 1. Lubricants G1, G2 are applied on the fitting region between the groove portion 11 and the first holding portion 30, the lubricants G1, G2 being described later. The groove portion 11 can be formed along the axial direction with a streaky slit portion, not shown, that constitutes an air passage. For example, when the slit portion is formed along the outer circumferential wall 11b so as to lead from the bottom portion 11c of the groove portion 11 to the opening portion 11d, air escapes from the slit portion when the first holding portion 30 is fitted, and the first holding portion 30 of the gasket 3 is easily inserted into the outer circumferential surface 1aa of the first pipe 1, corresponding to the inner circumferential wall 11a of the groove portion 11. Further, when the first pipe 1 is pulled out, since the slit portion is formed, the lubricants G1, G2 are held in the slit portion, and the resistance generated in the first holding portion 30 is reduced, thereby achieving easier pull-out operation. The flange portion 12A is larger in diameter than the through hole 10A and smaller than the step portion 102 so as to fit in the step portion 102 provided for the wall body 101, and the flange portion 12A is formed with an insertion hole, not shown, through which a fixing member such as a screw is inserted. One end 1a of the first pipe 1 is fixed to the wall body 101 by fixing the flange portion 12 to the outer surface of the wall body 101 by the fixing member, not shown.

The other end 1b of the first pipe 1 has an annular flange portion 12B protruding outward in the radial direction. The flange portion 12B has an insertion hole, not shown, into which a fixing member such as a screw is inserted, and the other end 1b of the first pipe 1 is fixed to the wall body 103 by adhering to the outer surface of the wall body 103 of the lower case 100C by the fixing member, not shown. An annular ring gasket 7 of which cross-section is approximately circular is provided between the tip portion 1ba of the other end 1b of the first pipe 1 and the outer wall 104a of the step portion 104. Thereby, a space between the outer end 1b of the first pipe 1 and the connection region is sealed. The tip side of the end portion 2a of the second pipe 2 has an inclined tip portion 2ab, referring to FIG. 5, of which diameter is slightly smaller than the other region so as to easily attach to or detach from the gasket 3.

<First Holding Portion>

As illustrated in FIG. 5, the first holding portion 30 constituting a part of the gasket 3 has an inner circumferential first lip portion 32, an inner circumferential protruding portion 33, an outer circumferential lip portion 31, a flat portion 34, and an end portion 35. The inner circumferential first lip portion 32 is an approximately right triangular annular lip formed continuously in the circumferential direction, and a plurality of inner circumferential first lip portions 32 are provided. A portion corresponding to the hypotenuse of the inner circumferential first lip portion 32 elastically contacts the outer circumferential surface 1aa of the first pipe 1, and is elastically deformed so as to fall down by being gradually inserted into the groove portion 11, and the inner circumferential first lip portion 32 is fitted to the groove portion 11 in that state. Therefore, the inner circumferential first lip portion 32 is elastically deformed in the direction opposite to the falling direction by the elastic deformation along the insertion direction of the first pipe 1 and is attached to the groove portion 11, referring to the enlarged view of the X in FIG. 2. The inner circumferential protruding portion 33 is provided adjacent to the inner circumferential first lip portion 32 and is formed in an approximately isosceles triangle shape in a cross-sectional view, and the protruding dimension of the inner circumferential protruding portion 33 is smaller than that of the inner circumferential first lip portion 32. The outer circumferential lip portion 31 is an annular lip continuously formed in the circumferential direction, and elastically contacts the inner circumferential surface 10a of the through hole 10A with a clamping allowance associated with bending deformation. The protruding dimension of the outer circumferential lip portion 31 is larger than that of the inner circumferential first lip portion 32. The flat portion 34 is formed flat so as to abut on the outer circumferential wall 11b of the groove portion 11. The end portion 35 is formed flat so as to abut along the bottom portion 11c of the groove portion 11. A plurality of inner circumferential first lip portions 32 are provided side by side, and the area on the inner circumferential side where a plurality of inner circumferential first lip portions 32, 32 are provided is referred to as an inner seal area S1. The inner seal area S1 is a sealing portion that separates the cooling medium flow path, and can be said to be an area that seals the cooling medium flow path outside the inverter case 100. The area on the outer circumferential side where the outer circumferential lip portion 31 is provided is referred to as an outer seal area S2. The outer seal area S2 can be said to be a seal area separating the inside and outside of the inverter case 100.

In the connection structure of the pipe according to the present embodiment, since the inner seal area S1 and the outer seal area S2 are provided at positions that do not overlap in the radial direction, the insertion load is prevented from increasing when the first pipe fixed and assembled with the gasket 3 on one end 1a is inserted into the through hole 10A of the wall body 101, thereby facilitating assembly performance. Further, even if the axial center L1 of the first pipe 1 and the axial center L of the through hole 10A are shifted and eccentric, since the inner seal area S1 and the outer seal area S2 are provided at positions that do not overlap in the radial direction, the sealing ability is maintained without being affected by the surface pressure fluctuation and the inner stress of the inner and the outer seal areas S1, S2 when the axial centers are eccentric. Further, the inner seal area S1 is provided on the opposite side against the insertion direction of the first pipe 1 further than the outer seal area S2, the outer circumferential surface corresponding to the portion where the inner seal area S1 is formed is a flat portion 34, and the inner seal area S1 is fitted to the groove portion 11 of the first pipe 1. Therefore, even if the first pipe 1 is eccentric, the sealing ability to the first pipe 1 is maintained by the plurality of inner circumferential first lip portions 32, 32 provided in the inner seal area S1, thereby achieving stable sealing ability.

Since the inner circumferential protruding portion 33 is provided on the inner circumferential surface 30a corresponding to the position of the outer circumferential lip portion 31, even if the force that makes the first pipe 1 eccentric is applied, the first pipe 1 is able to be kept in the correct position, where the axial center of the first pipe 1 and the axial center L of the through hole 10A approximately coincide. Further, even when the first pipe 1 becomes eccentric, the inner circumferential protruding portion 33 abuts on the outer circumferential surface 1aa of the first pipe 1 to suppress over-compression of the inner circumferential first lip portion 32 and to prevent impact on the seal surface pressure of the inner circumferential first lip portion 32, thereby keeping good sealing ability. Furthermore, although the first holding portion 30 attached to the first pipe 1 generates force to escape from the groove portion 11 when the pressure of the cooling medium through the first pipe 1 increases, the pressing force of the inner circumferential first lip portion 32 and the inner protruding portion 33 acts so as not to escape the first holding portion 30 from the groove portion 11. The present embodiment illustrates an example in which the inner circumferential protruding portion 33 abuts on the outer circumferential surface 1aa of the first pipe 1, but it can be configured such that the inner circumferential protruding portion 33 elastically contacts the outer circumferential surface 1aa when the first pipe is eccentric and that the inner circumferential protruding portion 33 is adjacent to the outer circumferential surface 1aa (there is a slight gap) when the first pipe 1 is at the correct position.

The outer circumferential surface 30b of the first holding portion 30 has an outer circumferential lip portion 31 that abuts on the inner circumferential surface 10a of the through hole 10A in an elastic deformed state. As illustrated in FIG. 2 and so on, the outer circumferential lip portion 31 is deformed in a fallen state and elastically contacts the inner circumferential surface 10a of the through hole 10A, so that the sealing ability with the inner circumferential surface 10a of the through hole 10A is maintained even when the first pipe 1 or the second pipe 2 becomes eccentric, thereby achieving high followability because of the bending deformation of the outer circumferential lip portion 31.

<Lubricant>

As illustrated in the enlarged view of X in FIG. 2, the enlarged view of Y in FIG. 4, and the like, the lubricant G1 is applied to the elastic contact region of the inner circumferential first lip portions 32, 32 provided for the first holding portion 30 with the outer circumferential surface 1aa of the first pipe 1. Further, the lubricant G2 is applied to the elastic contact region of the flat portion 34 provided for the first holding portion 30 with the outer circumferential wall 11b. Thus, the resistance on the first holding portion 30 including the circumferential first lip portions 32, 32 when the first pipe 1 is pulled out of the through hole 10A becomes smaller than the total of the resistance on the outer circumferential lip portion 31 against the pull-out direction and that on the inner circumferential second lip portion 42 against the pull-out direction. In other words, the resistance or load applied when the first pipe 1 is pulled out is; the inner seal are S1<the outer seal area S2+the lip formation area A.

When the first pipe 1 and the second pipe 2 are connected via the gasket 3, in addition to preventing leakage of the cooling medium in the first pipe 1 and the second pipe 2, in order to secure the sealing ability capable of preventing intrusion of rain water and so on from the outside of the inverter case 100 (on the first pipe 1 side), the resistance on the first holding portion 30 including the inner circumferential first lip portion 32 is designed to be larger than the total of the resistance on the outer circumferential lip portion 31 against the pull-out direction and that on the inner circumferential second lip portion 42 against the pull-out direction. That is, the compression amounts of various lips (the inner circumferential first lip portion 32, the outer circumferential lip portion 31, the inner circumferential second lip portion 42, etc.) provided for the gasket 3 so as not to be easily pulled out the first pipe 1 from the through hole 10A are as high as possible in the range of, for example, 0.2 mm to 0.7 mm, the larger the compression amount, the better the sealing ability. However, only the first pipe 1 is not pulled out during maintenance, and the gasket 3 is also removed when the first pipe 1 is tried to be pulled out. However, as described above, when the lubricants G1, G2 are applied on the elastic contact region of the inner circumferential first lip portions 32, 32 provided for the first holding portion 30 to the outer circumferential surface 1aa and on the elastic contact region of the flat portion 34 to the outer circumferential wall 11b, the resistance of the inner seal area S1 is reduced by about 80% even if the compression amount is the same. Therefore, even after only the first pipe 1 is pulled out from the through hole 10A at the time of maintenance or the like, the gasket 3 and the second pipe 2 are kept to be attached to the through hole 10A, so that the space between the through hole 10A and the first holding portion 30 is sealed by the outer circumferential lip portion 31, the space between the second pipe 2 and the second holding portion 40 is sealed by the inner circumferential second lip portion 42, and the cooling medium flowing in the first pipe 1 and the second pipe 2 is prevented from entering the upper case 100B when the first pipe 1 is removed. In addition, in the case of assembling the first pipe 1 and the gasket 3 in the production process and so on, the insertion load is reduced, thereby facilitating assembly operation.

The lubricants G1, G2 are not particularly limited, but a silicone-based oil is preferable because it has little influence on a rubber material and the cooling medium when the gasket 3 is made of, for example, ethylene propylene rubber. A silicone-based oil does not evaporate or crystallize under the usage environment, does not deteriorate peripheral members, or does not inhibit deformation of the gasket 3. Examples of the silicone-based oil are KF-96 1000CS manufactured by Shin-Etsu Chemical Co., Ltd. The viscosity of the lubricants G1, G2 is not particularly limited, but the lower the viscosity, the lower the friction due to oozing and sagging, and the higher the viscosity, the worse the handleability, so that the basic viscosity is preferably 700 $mm^2/S$ to 1000 $mm^2/S$ at 25 degrees Centigrade. The method for applying the lubricants G1, G2 on the elastic contact region is not particularly limited, but can be transferred to the gasket 3 by containing the lubricants in a sponge or the like, or can be applied on the groove portion 11.

<Joint Portion>

The joint portion 50 joins the first holding portion 30 attached to one end 1a of the first pipe 1 and the second holding portion 40 attached to the end portion 2a of the second pipe 2, and is elastically deformable. Since the first holding portion 30 and the second holding portion 40 have different diameters from each other corresponding to the diameters of the first pipe 1 and the second pipe 2, the joint portion 50 is tapered.

The joint portion 50 has an outer circumferential protruding portion 51 having a mountain-like cross section adjacent to the outer circumferential lip portion 31 along the insertion direction side (on the second holding portion 40 side) and elastically contacting the inner circumferential surface 10a of the through hole 10A. The outer circumferential protruding portion 51 can be continuously formed along the circumferential direction or can be formed at appropriate intervals. The outer circumferential protruding portion 51 is formed to have a mountain-like cross section of which protruding dimension is smaller than that of the outer circumferential lip portion 31.

The embodiment illustrates the figures in which the outer circumferential protruding portion 51 abuts on the inner circumferential surface 10a of the through hole 10A, but the outer circumferential protruding portion 51 can be adjacent to the inner circumferential surface 10a (with a slight space) and elastically abut on the inner circumferential surface 10a when the first pipe 1 or the second pipe 2 becomes eccentric.

<Second Holding Portion>

The inner circumferential surface 40a of the second holding portion 40 has the lip formation area A which abuts on the outer circumferential surface 2a of the second pipe 2 and has the annular inner circumferential second lip portion 42. An annular concave linear portion 41 is provided for the outer circumferential surface 40b of the second holding portion 40 corresponding to the lip formation area A formed on the inner circumferential surface 40a. The lip formation area A is a seal area that separates the cooling medium flow path, and is said to be an area that seals the cooling medium flow path in the inverter case 100. The concave linear portion 41 is annularly formed along the circumferential direction, and a reinforce ring 4 is housed in the concave linear portion 41 in a fitted state, the reinforce ring 4 reinforcing fitting of the second holding portion 40 to the second pipe 2. The reinforce ring 4 is an annular body made of a metal material, a synthetic resin material, or the like and the dimensions of the groove depth and the groove width of the concave linear portion 41 are decided depending on the reinforce ring 4. When the reinforce ring 4 being housed in the concave linear portion 41 of the second holding portion 40 is fitted onto the second pipe 2, a tightening action in the centripetal direction is exerted, and the sealing force of the reinforce ring 4 and the inner circumferential second lip portion 42 to the second pipe 2 is strengthened, thereby stably holding the second pipe 2.

At the end portion of the second holding portion 40, that is, the other end 3b side of the gasket 3, a protruding portion 43 is formed adjacent to the inner circumferential second lip portion 42. The protruding portion 43 is continuously formed along the circumferential direction, and the top portion is formed to have a mountain-like cross-section so as to incline opposite to the insertion direction so that the gasket 3 is easily inserted into the second pipe 2. The protruding portion 43 is formed so as to elastically contact the outer circumferential surface 2aa of the second pipe 2. The protruding dimension of the protruding portion 43 and the interval with the adjacent inner circumferential second lip portion 42 are preferably determined in such a manner that the protruding portion 43 has suitable protruding dimension and suitable interval so as not to abut on the inner circumferential second lip portion 42 even if the protruding portion 43 is fitted to the outer circumferential surface 2aa of the second pipe 2, the top portion is slightly elastically deformed and the protruding portion 43 falls into the side of the inner circumferential lip portion 42, and the protruding dimension of the protruding portion 43 is designed to be smaller than that of the inner circumferential second lip portion 42.

The inner circumferential second lip portion 42 has a mountain-like cross section, a plurality of inner circumferential second lip portions 42 are annularly formed along the circumferential direction at a certain distance (interval). The protruding dimensions of the inner circumferential second lip portions 42, 42, 42 are greater than the distance between the adjacent inner circumferential second lip portions 42, 42. The inner circumferential second lip portion 42 is configured to elastically contact the second pipe 2 with a clamping allowance, and the distance between the adjacent inner circumferential second lip portions 42, 42 is larger than the clamping allowance of the inner circumferential second lip portion 42. The second pipe 2 sometimes vibrates or thermal swelling occurs in the second pipe 2 depending on the material of the second pipe 2, but even in such a case, when a plurality of inner circumferential second lip portions 42, 42 are provided as described above, the adjacent inner circumferential second lip portions 42, 42 do not come into contact with each other in the assembled state to the second pipe 2 and follow the movement of the second pipe 2, thereby keeping the sealing ability. Further, since the adjacent inner circumferential second lip portions 42, 42 do not come into contact with each other in the assembled state to the second pipe 2, the lip reaction force does not increase excessively due to mutual adhesion of the inner circumferential second lip portions 42 (adhesion does not occur between the inner circumferential second lip portions 42, 42), thereby preventing increase in the insertion load and the pull-out load and improving the performance of insertion and pull-out operations.

With reference to FIG. 2, a procedure for connecting the first pipe 1 and the second pipe 2 in the through hole 10A using the gasket 3 configured as described above is described.

<Connection Procedure>

First, in the gasket 3, the reinforce ring 4 is fitted to and housed in the concave linear portion 41 of the second holding portion 40 in advance. Next, the first holding portion 30 of the gasket 3 is fitted to the groove portion 11 of one end 1a of the first pipe 1, thus the gasket 3 is assembled to the first pipe 1. At the time of assembly, the inner circumferential first lip portion 32 is elastically deformed in such a state that the inner circumferential first lip portion 32 falls obliquely from the bottom portion 11c toward the opening portion 11d (like the sate illustrated in the enlarged view of X in FIG. 2). Further, the ring gasket 7 is attached to the other end 1b of the first pipe 1. At this time, predetermined amounts of lubricants G1, G2 are applied on the inner circumferential first lip portions 32, 32 and the flat portion 34 of the first holding portion 30 of the gasket 3 in advance.

The ring gasket 7 and then the first pipe 1 are inserted from the other end 1b of the first pipe 1 to the through hole 10B of the wall body 103. At the same time, the gasket 3 and then the first pipe 1 are inserted into the through hole 10A of the wall body 101 from the outside. The other end 3b of the gasket 3 leads to the end portion 2a of the second pipe 2, and at first, the top portion of the protruding portion 43 elastically contacts the tip end portion 2ab of the second pipe 2. Since the tip end portion 2ab has a smaller diameter than the other portions of the second pipe 2 and inclines so as to have a larger diameter, the protruding portion 43 inclined to the opposite side of the insertion direction is smoothly and elastically deformed. Next, the inner circumferential second lip portion 42 provided on the other end 3b side elastically contacts the outer circumferential surface 2aa of the second pipe 2, is elastically deformed while being compressed, and is fitted onto the second pipe 2 so as to cover the second pipe 2 while being inclined obliquely. At the time, when the axial centers of the first pipe 1 and the second pipe 2 to be inserted deviate from the axial center L of the through hole the outer circumferential protruding portion 51 abuts on the inner circumferential surface 10a of the through hole 10A, thereby preventing eccentricity of the first pipe 1 and the second pipe 2 and reducing the effect on the seal surface pressure of the outer circumferential lip portion 31. Since the outer circumferential protruding portion 51 is provided on the second holding portion 40 side of the outer circumferential lip portion 31 and is arranged on the side opposite to the direction in which the outer circumferential lip portion 31 falls, the outer circumferential protruding portion 51 and the outer circumferential lip portion 31 do not touch each other. Further, since the outer circumferential protruding portion 51 is provided on the first holding portion 30 side of the joint portion 50, the outer circumferential protruding portion 51 is configured so as to surely abut on the inner circumferential surface 10a of the through hole 10A. Furthermore, the outer circumferential protruding portion 51 also has the effect of removing foreign matters on the inner circumferential surface 10a of the through hole 10A when the gasket 3 is inserted, and it is configured that the foreign matters are not bit on the contact surface of the outer circumferential lip portion 31.

As illustrated in FIG. 2, the first pipe 1 is inserted in such a manner that the flange portions 12A, 12B of the first pipe 1 respectively fit in the step portions 102, 104 and abut on the wall bodies 101, 103. Then, one end 1a of the first pipe 1 is in such a state that the outer circumferential lip portion 31 elastically contacts the inner circumferential surface 10a of the through hole 10A, and the other end 1b is in such a state that the ring gasket 7 elastically contacts the step portion 104. At this time, since the inner seal area S1 and the outer seal area S2 of the gasket 3 are provided at positions so as not to overlap in the radial direction, the increase in the insertion load is prevented and the assembly performance is improved. Further, even when the axial center of the first pipe 1 and the axial center L of the through hole 10A are misaligned and eccentric, since the inner seal area S1 and the outer seal area S2 are provided at positions so as not to overlap in the radial direction, the surface pressure change and the inner stress of the inner and the outer seal areas S1, S2 in such an eccentric condition are less affected, thereby maintaining stable sealing ability. Further, at this time, since the joint portion 50 has elasticity to be displaced in the radial direction, even if there is a slight deviation between the axial center L of the through hole 10A and the axial center of the second pipe 2, such a deviation is absorbed by the elastic deformation of the joint portion 50. In particular, since the joint portion 50 is tapered, in addition to that the joint portion 50 itself is made of an elastic body, the deviation of eccentricity is effectively absorbed. Then, when the flange portion 12A of the first pipe 1 is fixed to the wall body 101 by a fixture, not shown, the connection of the first pipe 1 and the second pipe 2 is completed.

In the connection state illustrated in FIG. 2, the fit portion of the first holding portion 30 onto the first pipe 1 and the fit portion of the second pipe 2 onto the second holding portion 40 are respectively interposed by the annular inner circumferential first lip portion 32 and the inner circumferential second lip portion 42 under a compressed condition, so that the connection structure has high sealing ability and the cooling medium is capable of communicating via the gasket 3 between the first pipe 1 and the second pipe 2. Further, by interposing the annular outer circumferential lip portion 31 under a compressed condition between the first holding portion 30 and the through hole 10A, the inside and outside of the inverter case 100 through the through hole 10A are sealed and dust and so on are prevented from entering the inverter case 100 via the through hole 10A from the outside.

Next, with reference to FIG. 2 to FIG. 4, the pull-out procedure for pulling out the first pipe 1 connected as described above is described.

<Pull-Out Procedure>

First, the fixtures, not shown, for fixing the first pipe 1 to the wall bodies 101 and 103 are removed, the first pipe 1 is grasped, and force is applied in the direction of separating the first pipe 1 from the second pipe 2, that is, in the pull-out direction. Then, since the resistance on the first holding portion 30 including the inner circumferential first lip portions 32, 32 is designed to be smaller than the total of the resistance on the outer circumferential lip portion 31 against the pull-out direction and that on the inner circumferential second lip portions 42, 42, 42 against the pull-out direction, only the first pipe 1 is pulled out. That is, when the resistance on the inner circumferential first lip portions 32, 32 applied when the first pipe 1 is pulled out from the through hole 10A is larger than the total of the resistance against the pull-out direction generated in the outer circumferential lip portion 31 and that in the inner circumferential second lip portions 42, 42, 42, the gasket 3 is also pulled out when the first pipe 1 is pulled out; however, in the above-mentioned configuration, only the first pipe 1 is pulled out when the first pipe 1 is pulled out through hole 10A.

The above-mentioned embodiments describe the connection structure of the pipe in which the second pipe 2 provided in the automobile inverter case 100 and the first pipe 1 provided outside the inverter case 100 are connected by the gasket 3; however, the embodiment is applicable to other connection structure of the pipe as long as the first pipe and the second pipe arranged in an axially spaced state so as to be opposed each other are connected via the gasket in the through hole of the wall body. Further, the configuration of the gasket 3 is only an example and is not limited to those illustrated in the figures, and the number and the shape (protruding dimension, protruding width and so on) of the inner circumferential second lip portion 42, the protruding portion 43, the outer circumferential lip portion 31, the inner circumferential first lip portion 32, the inner circumferential protruding portion 33, and the outer circumferential protruding portion 51 are not limited to those illustrated in the figures. The shape of the through holes 10A, 10B formed in the wall bodies 101, 103 is not particularly limited to those illustrated in the figures, and depends on the shape and the size of the first pipe 1 (external hose) to be connected with the second pipe 2. Further, the groove portion 11 and the flange portions 12A, 12B can be integrally formed with the first pipe 1 as illustrated in FIG. 1, or can be configured to be fitted to a tubular pipe as a separate body.

REFERENCE SIGNS LIST 100 inverter case
101 wall body 10A through hole
10a inner circumferential surface
1 first pipe
2 second pipe
3 connection member
30 first holding portion
30b outer circumferential surface
31 outer circumferential lip portion
40 second holding portion
50 joint portion
51 outer circumferential protruding portion

The invention claimed is:

1. A connection structure of a pipe in which a first pipe provided outside a case and a second pipe provided inside the case are connected via a gasket while sealing a space between the first pipe and a through hole provided on a wall body of the case and a space between the through hole and the second pipe,
the gasket comprising:
a tubular first holding portion to be fitted onto one end of the first pipe;
an inner circumferential first lip portion provided on an inner circumferential surface of the first holding portion and elastically contacting an outer circumferential surface of the first pipe;
an outer circumferential lip portion provided on an outer circumferential surface of the first holding portion and elastically contacting an inner circumferential surface of the through hole;
a tubular second holding portion to be fitted onto an end portion of the second pipe provided in the case; and
an inner circumferential second lip portion provided on an inner circumferential surface of the second holding portion and elastically contacting an outer circumferential surface of the second pipe,
wherein resistance applied on the first holding portion including the inner circumferential first lip portion when the first pipe is pulled out of the through hole is smaller than total of resistance generated in the outer circumferential lip portion against pull-out direction and resistance generated in the inner circumferential second lip portion against pull-out direction;
wherein lubricant is applied on an elastic contact region of the inner circumferential first lip portion with the outer circumferential surface of the first pipe.

2. The connection structure of a pipe according to claim 1,
wherein the first pipe has an annular groove portion to be fitted with the first holding portion,
wherein the first holding portion has a flat portion formed to be flat so as to abut along an outer circumferential wall of the annular groove portion, and
wherein lubricant is applied on an elastic contact region of the flat portion with the outer circumferential wall.

3. The connection structure of a pipe according to claim 2, wherein the case houses electronic equipment, and cooling medium for cooling the electronic equipment flows through the first pipe and the second pipe.

4. The connection structure of a pipe according to claim 1, wherein the case houses electronic equipment, and cooling medium for cooling the electronic equipment flows through the first pipe and the second pipe.

5. A connection structure of a pipe in which a first pipe provided outside a case and a second pipe provided inside the case are connected via a gasket while sealing a space between the first pipe and a through hole provided on a wall body of the case and a space between the through hole and the second pipe,
the gasket comprising:
a tubular first holding portion to be fitted onto one end of the first pipe;
an inner circumferential first lip portion provided on an inner circumferential surface of the first holding portion and elastically contacting an outer circumferential surface of the first pipe;
an outer circumferential lip portion provided on an outer circumferential surface of the first holding portion and elastically contacting an inner circumferential surface of the through hole;
a tubular second holding portion to be fitted onto an end portion of the second pipe provided in the case; and
an inner circumferential second lip portion provided on an inner circumferential surface of the second holding portion and elastically contacting an outer circumferential surface of the second pipe,
wherein resistance applied on the first holding portion including the inner circumferential first lip portion when the first pipe is pulled out of the through hole is smaller than total of resistance generated in the outer circumferential lip portion against pull-out direction and resistance generated in the inner circumferential second lip portion against pull-out direction,
wherein the first pipe has an annular groove portion to be fitted with the first holding portion,
wherein the first holding portion has a flat portion formed to be flat so as to abut along an outer circumferential wall of the annular groove portion, and
wherein lubricant is applied on an elastic contact region of the flat portion with the outer circumferential wall.

6. A connection structure of a pipe in which a first pipe provided outside a case and a second pipe provided inside the case are connected via a gasket while sealing a space between the first pipe and a through hole provided on a wall body of the case and a space between the through hole and the second pipe,
the gasket comprising:
a tubular first holding portion to be fitted onto one end of the first pipe;
an inner circumferential first lip portion provided on an inner circumferential surface of the first holding portion and elastically contacting an outer circumferential surface of the first pipe;
an outer circumferential lip portion provided on an outer circumferential surface of the first holding portion and elastically contacting an inner circumferential surface of the through hole;
a tubular second holding portion to be fitted onto an end portion of the second pipe provided in the case; and
an inner circumferential second lip portion provided on an inner circumferential surface of the second holding portion and elastically contacting an outer circumferential surface of the second pipe,
wherein resistance applied on the first holding portion including the inner circumferential first lip portion when the first pipe is pulled out of the through hole is smaller than total of resistance generated in the outer circumferential lip portion against pull-out direction and resistance generated in the inner circumferential second lip portion against pull-out direction,
wherein the first pipe has an annular groove portion to be fitted with the first holding portion, wherein the first holding portion has a flat portion formed to be flat so as to abut along an outer circumferential wall of the annular groove portion,
wherein lubricant is applied on an elastic contact region of the flat portion with the outer circumferential wall, and
wherein the case houses electronic equipment, and cooling medium for cooling the electronic equipment flows through the first pipe and the second pipe.

* * * * *